(12) United States Patent
Campbell

(10) Patent No.: US 8,284,590 B2
(45) Date of Patent: Oct. 9, 2012

(54) INTEGRATABLE PROGRAMMABLE CAPACITIVE DEVICE

(75) Inventor: Kristy A. Campbell, Boise, ID (US)

(73) Assignee: Boise State University, Boise, ID (US)

( * ) Notice: Subject to any disclaimer, the term of this patent is extended or adjusted under 35 U.S.C. 154(b) by 372 days.

(21) Appl. No.: 12/775,237

(22) Filed: May 6, 2010

(65) Prior Publication Data

US 2011/0273921 A1    Nov. 10, 2011

(51) Int. Cl.
*G11C 11/24* (2006.01)
(52) U.S. Cl. .............................. 365/149; 365/163
(58) Field of Classification Search .............. None
See application file for complete search history.

(56) References Cited

U.S. PATENT DOCUMENTS

| | | | |
|---|---|---|---|
| 6,144,546 A * | 11/2000 | Mizushima et al. | 361/303 |
| 6,646,902 B2 | 11/2003 | Gilton et al. | |
| 6,784,018 B2 | 8/2004 | Campbell et al. | |
| 6,812,087 B2 | 11/2004 | Giltom et al. | |
| 6,813,176 B2 | 11/2004 | Gilton et al. | |
| 6,813,178 B2 | 11/2004 | Campbell et al. | |
| 6,849,868 B2 | 2/2005 | Campbell | |
| 6,856,002 B2 | 2/2005 | Moore et al. | |
| 6,861,367 B2 | 3/2005 | Gilton et al. | |
| 6,864,521 B2 | 3/2005 | Moore et al. | |
| 6,867,064 B2 | 3/2005 | Campbell et al. | |
| 6,867,114 B2 | 3/2005 | Moore et al. | |
| 6,867,996 B2 | 3/2005 | Campbell et al. | |
| 6,881,623 B2 | 4/2005 | Campbell et al. | |
| 6,888,155 B2 | 5/2005 | Campbell | |
| 6,891,749 B2 | 5/2005 | Campbell et al. | |
| 6,912,147 B2 | 6/2005 | Campbell | |
| 6,921,912 B2 | 7/2005 | Campbell | |
| 6,930,909 B2 | 8/2005 | Moore et al. | |
| 6,953,720 B2 | 10/2005 | Moore et al. | |
| 6,955,940 B2 | 10/2005 | Campbell et al. | |
| 6,956,761 B2 | 10/2005 | Campbell | |
| 6,961,277 B2 | 11/2005 | Moore et al. | |
| 6,998,697 B2 | 2/2006 | Campbell et al. | |
| 7,015,494 B2 | 3/2006 | Campbell | |
| 7,018,863 B2 | 3/2006 | Moore et al. | |
| 7,030,405 B2 | 4/2006 | Campbell | |
| 7,050,327 B2 | 5/2006 | Campbell | |
| 7,056,762 B2 | 6/2006 | Moore et al. | |
| 7,061,004 B2 | 6/2006 | Campbell | |
| 7,064,080 B2 | 6/2006 | Gilton et al. | |
| 7,067,348 B2 | 6/2006 | Campbell et al. | |
| 7,087,454 B2 | 8/2006 | Campbell et al. | |
| 7,087,919 B2 | 8/2006 | Campbell et al. | |
| 7,105,864 B2 | 9/2006 | Campbell et al. | |

(Continued)

OTHER PUBLICATIONS

Ande, H.K., "A new approach to the design, fabrication, and testing of chalcogenide-based multi-state phase-change nonvolatile memory", "Circuits and Systems", Aug. 10, 2008, pp. 570-573, Published in: US.

(Continued)

*Primary Examiner* — Alexander Sofocleous
(74) *Attorney, Agent, or Firm* — Parsons Behle & Latimer

(57) ABSTRACT

A circuit with a capacitive device is disclosed. The circuit may comprise a capacitive device connected between a first conductor and a second conductor. The capacitive device may comprise a first electrode connected to the first conductor and a second electrode being connected to the second conductor. A chalcogenide layer may be connected to the first electrode and to a metal chalcogenide layer.

20 Claims, 6 Drawing Sheets

U.S. PATENT DOCUMENTS

| | | | |
|---|---|---|---|
| 7,151,273 | B2 | 12/2006 | Campbell et al. |
| 7,153,721 | B2 | 12/2006 | Campbell |
| 7,163,837 | B2 | 1/2007 | Moore et al. |
| 7,190,048 | B2 | 3/2007 | Campbell |
| 7,220,982 | B2 | 5/2007 | Campbell |
| 7,223,627 | B2 | 5/2007 | Moore et al. |
| 7,251,154 | B2 * | 7/2007 | Hush ............................ 365/148 |
| 7,274,034 | B2 | 9/2007 | Campbell et al. |
| 7,277,313 | B2 | 10/2007 | Campbell et al. |
| 7,282,783 | B2 | 10/2007 | Campbell |
| 7,288,784 | B2 | 10/2007 | Moore et al. |
| 7,289,349 | B2 | 10/2007 | Campbell et al. |
| 7,294,527 | B2 | 11/2007 | Campbell et al. |
| 7,304,368 | B2 | 12/2007 | Campbell |
| 7,315,465 | B2 | 1/2008 | Campbell et al. |
| 7,317,200 | B2 | 1/2008 | Campbell |
| 7,317,567 | B2 | 1/2008 | Campbell |
| 7,326,950 | B2 | 2/2008 | Campbell |
| 7,329,558 | B2 | 2/2008 | Campbell |
| 7,332,735 | B2 | 2/2008 | Campbell |
| 7,344,946 | B2 | 3/2008 | Moore et al. |
| 7,348,205 | B2 | 3/2008 | Campbell et al. |
| 7,348,209 | B2 | 3/2008 | Campbell |
| 7,354,793 | B2 | 4/2008 | Campbell |
| 7,365,411 | B2 | 4/2008 | Campbell |
| 7,366,030 | B2 | 4/2008 | Campbell et al. |
| 7,385,868 | B2 | 6/2008 | Moore et al. |
| 7,387,909 | B2 | 6/2008 | Campbell |
| 7,393,798 | B2 | 7/2008 | Campbell |
| 7,396,699 | B2 | 7/2008 | Campbell et al. |
| 7,433,227 | B2 | 10/2008 | Campbell et al. |
| 7,459,764 | B2 | 12/2008 | Moore et al. |
| 7,491,962 | B2 | 2/2009 | Liu et al. |
| 7,518,212 | B2 | 4/2009 | Moore et al. |
| 7,542,319 | B2 | 6/2009 | Campbell et al. |
| 7,550,818 | B2 | 6/2009 | Moore et al. |
| 7,579,615 | B2 | 8/2009 | Daley et al. |
| 7,586,777 | B2 | 9/2009 | Campbell |
| 7,609,563 | B2 | 10/2009 | Campbell et al. |
| 7,619,247 | B2 | 11/2009 | Moore et al. |
| 7,646,007 | B2 | 1/2010 | Campbell et al. |
| 7,659,205 | B2 | 2/2010 | Campbell |
| 7,663,137 | B2 | 2/2010 | Campbell |
| 7,682,992 | B2 | 3/2010 | Campbell |
| 7,692,177 | B2 | 4/2010 | Moore et al. |
| 7,701,760 | B2 | 4/2010 | Campbell et al. |
| 7,709,885 | B2 | 5/2010 | Daley et al. |
| 7,723,713 | B2 | 5/2010 | Campbell et al. |
| 7,745,808 | B2 | 6/2010 | Campbell |
| 7,749,853 | B2 | 7/2010 | Campbell |
| 7,759,665 | B2 | 7/2010 | Campbell |
| 7,785,976 | B2 | 8/2010 | Campbell |
| 7,835,172 | B2 * | 11/2010 | Shinozaki ...................... 365/148 |
| 2003/0047765 | A1 | 3/2003 | Campbell |
| 2003/0143782 | A1 | 7/2003 | Gilton et al. |
| 2003/0146427 | A1 | 8/2003 | Campbell |
| 2004/0211957 | A1 | 10/2004 | Moore et al. |
| 2004/0223390 | A1 | 11/2004 | Campbell et al. |
| 2005/0247927 | A1 | 11/2005 | Campbell |
| 2005/0286294 | A1 | 12/2005 | Campbell |
| 2006/0045974 | A1 | 3/2006 | Campbell et al. |
| 2006/0131555 | A1 | 6/2006 | Liu et al. |
| 2007/0145463 | A1 | 6/2007 | Campbell |
| 2007/0158631 | A1 | 7/2007 | Daley et al. |
| 2007/0218583 | A1 | 9/2007 | Farnworth et al. |
| 2008/0067489 | A1 | 3/2008 | Campbell |
| 2008/0121859 | A1 | 5/2008 | Campbell |
| 2008/0164456 | A1 | 7/2008 | Campbell |
| 2008/0185574 | A1 | 8/2008 | Campbell et al. |
| 2008/0188034 | A1 | 8/2008 | Campbell |
| 2008/0237563 | A1 | 10/2008 | Campbell |
| 2009/0124041 | A1 | 5/2009 | Liu et al. |
| 2010/0027324 | A1 | 2/2010 | Campbell |

OTHER PUBLICATIONS

Britt et al, "Pulsed and Parallel-Polarization EPR Characterization of the Photosystem II Oxygen-Evolving Complex", "Annual Review of Biophysics and Biomolecular Structure", Jun. 1, 2000, pp. 463-495, vol. 29, Published in: US.

Britt et al, "Recent Pulsed EPR Studies of the Photosystem II Oxygen Evolving Complex: Implications as to Water Oxidation Mechanisms", "Biochimica et Biophysica Acta", Apr. 12, 2004, pp. 158-171, vol. 1655, No. 1-3, Published in: NL.

Campbell, et al, "Dual-Mode EPR Detects the Initial Intermediate in Photoassembly of the Photosystem II Mn Cluster the Influence of Ami", "Journal of the American Chemical Society", Mar. 30, 2000, pp. 3754-3761, vol. 122, No. 15, Published in: US.

Campbell, et al, "Parallel Polarization EPR Detection of an S1-State Multiline EPR Signal in Photosystem II Particles from Synechocystis", "Journal of the American Chemical Society", Jan. 6, 1998, pp. 447-448, vol. 120, No. 2, Published in: US.

Campbell, Kristy A., et al, "Phase-change memory devices with stacked Ge-chalcogenide/Sn-chalcogenide layers", "Microelectronics Journal", Jan. 1, 2007, pp. 52-59, vol. 38, No. 1, Published in: US.

Campbell, "Characterization of Sn, Zn, In, and Sb-containing GeSe alloys for phase-change electronic memory applications", "Materials Research Society Symposium Proceedings", Apr. 9, 2007, vol. 997, Published in: US.

Campbell, et al, "Chalcogenide bilayer materials used to create multi-state resistance variable devices", "Abstracts, 62nd Northwest Regional Meeting of the American Chemical Society", Jun. 17, 2007, vol. NW-234, Publisher: American Chemical Society, Published in: US.

Campbell et al, "Parallel Polarization EPR Characterization of the Mn(III) Center of Oxidized Manganese Superoxide Dismutase", "Journal of the American Chemical Societ", May 1, 1999, pp. 4714-4715, vol. 121, No. 19, Published in: US.

Campbell et al, "The t-Nitrogen of D2 Histidine 189 is the Hydrogen Bond Donor to the Tyrosine Radical YD of Photosystem II", "J. Am. Chem. Soc", Feb. 25, 1997, pp. 4787-4788, vol. 119, No. 20, Published in: US.

Campbell et al, "Dual-Mode EPR Study of Mn(III) Salen and the Mn(III) Salen-Catalyzed Epoxidation of cis-B-Methylstyrene", "Journal of the American Chemical Society", May 26, 2001, pp. 5710-5719, vol. 123, No. 24, Published in: US.

Campbell et al, "The 23 and 17 kDa Extrinsic Proteins of Photosystem II Modulate the Magnetic Properties of the S1-State Manganese Cluste", "Biochemistry", Mar. 21, 1998, pp. 5039-5045, vol. 37, No. 15, Published in: US.

Campbell et al, "Phase-change memory devices with stacked Ge-chalcogenide/Sn-chalcogenide layers", "Microelectronics Journal", Nov. 14, 2006, pp. 52-59, vol. 38, No. 1, Published in: US.

Davis, et al, "Synthesis and characterization of metal-doped chalcogenide glasses", "Abstracts, 62nd Northwest Regional Meeting of the American Chemical Society", Jun. 17, 2007, vol. NW-039, Publisher: American Chemical Society, Published in: US.

Debus, Richard J., et al, "Does Histidine 332 of the D1 Polypeptide Ligate the Manganese Cluster in Photosystem II? An Electron Spin Echo Envelope", "Biochemistry", Feb. 27, 2001, pp. 3690-3699, vol. 40, No. 12.

Debus et al, "Does Aspartate 170 of the D1 Polypeptide Ligate the Manganese Cluster in Photosystem II? An EPR and ESEEM Study", "Biochemistry", Aug. 21, 2003, pp. 10600-10608, vol. 42, No. 36, Published in: US.

Debus, Richard J., et al, "Glutamate 189 of the D1 Polypeptide Modulates the Magnetic and Redox Properties of the Manganese Cluster and Tyrosine YZ", "Biochemistry", May 6, 2000, pp. 6275-6287, vol. 39, No. 21, Publisher: American Chemical Society.

Debus, Richard J., et al, "Histidine 332 of the D1 Polypeptide Modulates the Magnetic and Redox Properties of the Manganese Cluster and Tyrosine YZ", "Biochemistry", Dec. 8, 1999, pp. 470-478, vol. 39, No. 2, Publisher: American Chemical Society.

Devasia et al, "Influence of Sn Migration on phase transition in GeTe and Ge2Se3 thin films", "Applied Physics Letters", Apr. 9, 2010, pp. 141908, vol. 96, Published in: US.

Devasia et al, "Analyzing residual stress in bilayer chalcogenide Ge2Se3/SnTe films", "Thin Solid Films", Apr. 8, 2009, pp. 6516-6519, vol. 517, No. 24, Published in: US.

Gupta et al, "W-2W Current Steering DAC for Programming Phase Change Memory", Apr. 3, 2009, pp. 1-4, Publisher: WMED 2009. IEEE Workshop on Apr. 3, 2009, Published in: US.

Campbell et al, "Parallel Polarization EPR Characterization of the Mn(III) Center of Oxidized Manganese Superoxide Dismutase", "Journal of the American Chemical Society", May 1, 1999, pp. 4714-4715, vol. 121, Published in: US.

Peloquin, Jeffrey M., et al, "55Mn Pulsed ENDOR Demonstrates That the Photosystem II Split EPR Signal Arises from a Magnetically-Coupled Mangano-Tyrosyl Complex", "Journal of the American Chemical Society", Jun. 27, 1998, pp. 6840-6841, vol. 120, No. 27, Publisher: American Chemical Society.

Peloquin, Jeffrey M., et al, "55Mn ENDOR of the S2-State Multiline EPR Signal of Phytosystem II Implications on the structure of the Tetranuclear Mn", "Journal of the American Chemical Society", Oct. 21, 2000, pp. 10926-10942, vol. 122, No. 44, Publisher: American Chemical Society.

Rapole et al, "Resistive Memory Sensing Using Delta-Sigma Modulation", Apr. 3, 2009, Publisher: WMED 2009. IEEE Workshop on Apr. 3, 2009, Published in: US.

Regner et al, "Integration of IC Industry Feature Sizes with University Back-End-of-Line Post Processing: Example Using a Phase-Change", Apr. 3, 2009, pp. 1-4, Publisher: WMED 2009. IEEE Workshop on Apr. 3, 2009, Published in: US.

Oblea, Antonio S., et al, "Silver Chalcogenide Based Memristor Devices", Jul. 19, 2010, Publisher: IEEE World Congress on Computational Intelligence.

Oblea et al, "Memristor SPICE Model Simulation & Device Hardware Correlation", May 6, 2010, Publisher: IEEE, Published in: US.

Edwards, Arthur H., et al, "Density Functional Study of Ag in Ge2Se3", Oct. 25, 2009, pp. 1-7, Publisher: Non-Volatile Memory Technology Symposium, Published in: US.

Pino, Robinson E., et al, "Compact Method for Modeling and Simulation of Memristor Devices", Jun. 17, 2010, pp. 1-7, Publisher: 2010 IEEE/ACM International Symposium on Nanoscale Architectures (NANOARCH).

* cited by examiner

INTEGRATABLE PROGRAMMABLE CAPACITIVE DEVICE

BACKGROUND

The present application relates generally to capacitive devices that may be used in an electric circuit. More specifically, the disclosure relates to a device comprising chalcogenide material and uses for the chalcogenide based device within a circuit, such as, for example, a Dynamic Random Access Memory (DRAM) circuit and/or a power related circuit.

Devices that comprise chalcogenide materials have previously been used in electric circuits. The tunnel diode exhibits a number of interesting attributes, such as fast switching and differential negative resistance ("DNR") (sometimes alternatively referred to as negative differential resistance or NDR). The tunnel diodes typically employ a quantum mechanical effect called the tunnel effect, which may be characterized by a non-ohmic behavior, such as by a non-linear current-voltage (I-V) curve.

Generally, ohmic devices, as opposed to non-ohmic devices, can be described by Ohm's law, V=IR, which states that current through a device is directly proportional to the voltage across the device. Thus, regarding an ohmic device, a larger current is seen through the ohmic device when a larger voltage is applied across the device. Typically, the I-V curve of an ohmic device shows a curve starting at the zero points of both voltage and current, with the curve increasing from the bottom left toward the top right of the graph, and showing consistently increasing current with increasing voltage. By contrast, the I-V curve of a device exhibiting DNR will show a rise from the zero points of voltage and current, to a peak, then a decrease from that peak, showing a decrease in current as the voltage continues to increase.

U.S. Pat. No. 7,015,494 ("the '494 patent"), to Campbell, describes an assembly comprising a chalcogenide material. The assembly demonstrates DNR and may be used for a device such as a tunnel diode. The '494 patent is incorporated herein, in its entirety, by reference.

Generally, DRAM circuits use a capacitive memory element to a store charge, which may be used to indicate a binary value. Large banks of capacitive charge containers are used in modern DRAM circuits and are closely spaced when fabricated. The containers are packed together to minimize the footprint of the capacitor, increasing the memory density per area. An increase in memory density, such as with a die shrink, typically equates to a reduced cost per bit of memory. Containers with large aspect ratios have been developed as DRAM microchips are reduced in size to fit more containers into the same area, or to fit the same number into a reduced area. Used in this application, the aspect ratio of a container is the ratio of the height to the diameter of the container. Thus, a container with a large aspect ratio is one with a large height relative to a diameter. Containers with large aspect ratios are typically more difficult to fabricate than containers with small aspect ratios. Further, a large aspect ratio may prevent the application of materials to, as well as the removal of debris from, the bottom of a container. DRAM microchips may benefit from the replacement of containers with a new technology.

U.S. Pat. No. 7,050,327, to Campbell ("the '327 patent"), discloses a device, and the fabrication of the device, that may be used as a memory cell. The '327 patent is incorporated herein, in its entirety, by reference. The device disclosed in the '327 patent demonstrates DNR and has a variable electric current characteristic. For example, the electric current measurable through the device when measured at a specific reading voltage, such as at 0.26V, can be changed by applying voltages within a certain range, such as within the range of 0.36V to 0.55V. The change in measurable electric current at the specific reading voltage is substantially persistent. Thus, a value can be stored in the device as a readable electric current value.

Changing a readable electric current value through a device diverges from the design of many types of DRAM, which generally use the aforementioned capacitive charge containers to store charge. Modern DRAM circuits use a measurement device, such as a sense amplifier, to measure the charge of a capacitive charge container. As such, non-capacitive memory devices may not be compatible with DRAM circuits, as they are currently designed.

The present disclosure is directed toward overcoming, or at least reducing the effects of one or more of the issues set forth above.

SUMMARY

A circuit is disclosed. The circuit may comprise a capacitive device. The capacitive device may comprise a first conductor, a chalcogenide layer, a metal chalcogenide layer, and a second conductor. The chalcogenide layer may be connected to the first conductor. The metal chalcogenide layer may be connected to the chalcogenide layer. The second conductor may be connected to the metal chalcogenide layer. The capacitive device may be configured to store charge.

The circuit may further comprise a source comprising a positive terminal and a negative terminal. The positive terminal may be connected to the first conductor and the negative terminal may be connected to the second conductor. Alternatively, the negative terminal may be connected to the first conductor and the positive terminal may be connected to the second conductor. The capacitive device may have a capacitance within the range of about 100 femtoFarads to about 100 picoFarads. The capacitive device may be configured to operate at a voltage of about 0.2 volts. The device may further comprise a metal layer. The metal layer may be disposed between the metal chalcogenide layer and the second conductor. The metal chalcogenide layer may be connected to the second conductor through the metal layer. The metal layer may comprise lead, tin, silver, indium, antimony, gold, or copper.

A memory circuit is disclosed. The memory circuit may comprise a capacitive device. The capacitive device may be connected to a sensing device. The capacitive device may comprise a first conductor, a chalcogenide layer, a metal chalcogenide layer, and a second conductor. The chalcogenide layer may be connected to the first conductor. The metal chalcogenide layer may be connected to the chalcogenide layer. The second conductor may be connected to the metal chalcogenide layer. The capacitive device may be configured to store a charge.

The sensing device may be configured to sense the charge stored in the capacitive device. The sensing device may comprise a sense amplifier. The first conductor may be connected to a voltage plane. The second conductor may be connected to a transistor. The second conductor may be connected to a voltage plane. The first conductor may be connected to a transistor.

A method is disclosed. The method may comprise providing a capacitive device. The capacitive device may comprise a metal chalcogenide layer, a first conductor, and a second conductor. The metal chalcogenide layer may be disposed between the first conductor and the second conductor. The method may further comprise connecting the first conductor and the second conductor to a source. The method may further comprise applying a first voltage across the first and second conductors with the source. The method may further comprise storing charge from the applied voltage in the capacitive device. The charge may be substantially stored in the metal chalcogenide layer.

The method may further comprise removing the applied voltage from the first conductor and the second conductor after storing the charge. The method may further comprise measuring the stored charge at the first and second conductors after removing the applied voltage. The stored charge may be measured by a circuit comprising a sense amplifier. The method may further comprise releasing at least a portion of the stored charge from the device. The charge may be released if the first voltage applied across the first and second conductors is substantially reduced. The first voltage applied across the first conductor and the second conductor may be about 0.2 volts. The capacitive device may further comprise a metal layer. The metal layer may be connected to the metal chalcogenide layer. The method may further comprise setting the capacitance of the capacitive device by applying a second voltage to the capacitive device and migrating metal from the metal layer into the metal chalcogenide layer. The method may further comprise setting the capacitance of the capacitive device by applying a second voltage to the capacitive device and migrating metal from the metal chalcogenide layer into the metal layer.

These and other embodiments of the present application will be discussed more fully in the description. The features, functions, and advantages can be achieved independently in various embodiments of the claimed invention, or may be combined in yet other embodiments.

BRIEF DESCRIPTION OF FIGURES

Like reference numbers and designations in the various drawings indicate like elements.

DETAILED DESCRIPTION

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention, and it is to be understood that modifications to the various disclosed embodiments may be made, and other embodiments may be utilized, without departing from the spirit and scope of the present invention. The following detailed description is, therefore, not to be taken in a limiting sense.

The term "substrate" used in the following description may include any supporting structure including, but not limited to, a semiconductor substrate that has an exposed substrate surface. A semiconductor substrate should be understood to include silicon, epitaxial silicon, silicon-on-insulator (SOI), silicon-on-sapphire (SOS), doped and undoped semiconductors, epitaxial layers of silicon supported by a base semiconductor foundation, and other semiconductor structures. When reference is made to a substrate in the following description, previous process steps may have been utilized to form regions or junctions in or over the base substrate or foundation. The substrate need not be semiconductor-based, but may be any support structure suitable for supporting the disclosed device, including, but not limited to, metals, alloys, glasses, natural and synthetic polymers, ceramics, fabrics, and any other suitable materials, as would be apparent to one of ordinary skill in the art, given the benefit of this disclosure.

Figure 1:
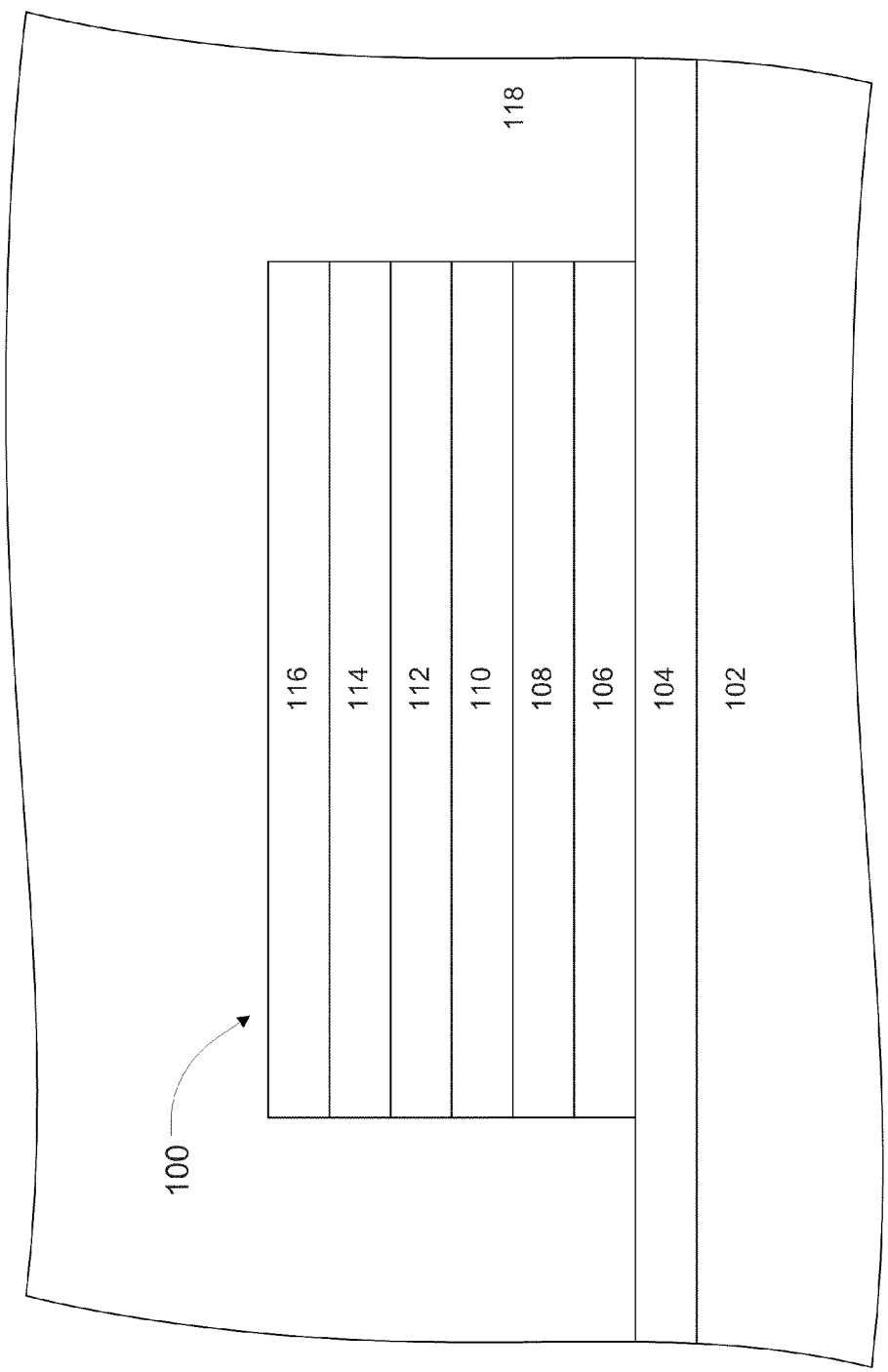
FIG. 1 is a cutaway view of an embodiment of an integratable programmable capacitive device.

FIG. 1 is a cross-sectional view of an embodiment of an integratable programmable capacitive device 100, such as might be fabricated on a semiconductor wafer. The integratable programmable capacitive device 100 comprises a substrate 102, a first insulative layer 104, a first conductor 106, a chalcogenide layer 108, a metal chalcogenide layer 110, a metal layer 112, an adhesive layer 114, a second conductor 116, and a second insulative layer 118. One or more of the layers may be optional. For example, the adhesion layer 114 may not be needed to adhere the conductor 116 to the metal layer 112. Also, additional layers may be added in between one or more of the layers. For example, additional adhesion layers may be added between one or more layers.

The first insulative layer 104 may be fabricated over the substrate 102, which acts to support the integratable programmable capacitive device 100. The first insulative layer 104 may comprise one or more materials, such as an oxide material, a nitride material, or another suitable insulative material, as would be apparent to one of ordinary skill in the art, given the benefit of this disclosure. The first insulative layer 104 may be fabricated on the substrate 102 through any method known in the art. Alternatively, the integratable programmable capacitive device 100 may be fabricated directly on the substrate 102.

The first conductor 106 may be fabricated on the first insulative layer 104. The first conductor 106 may be copper, aluminum, tungsten, or another suitable conductive material, as would be apparent to one of ordinary skill in the art, given the benefit of this disclosure. The first conductor 106 may connect to further conductive layers or circuitry, such as a voltage plane, a ground plane, a voltage supply, a driver circuit, a difference amplifier, a sense amplifier, or to other suitable circuitry, as would be apparent to one of ordinary skill in the art, given the benefit of this disclosure.

Chalcogens are generally represented on the periodic table of elements in Group 16, which comprises, among other elements, sulfur (S), selenium (Se), and tellurium (Te). A chalcogenide is generally a compound with an element from the chalcogen group and an electropositive element, such as, for example, cadmium (Cd), germanium (Ge), lead (Pb), tin (Sn), or copper (Cu). A metal chalcogenide is a generally a compound with an element from the chalcogen group and a metal, such as, for example, lead (Pb), tin (Sn), silver (Ag), indium (In), antimony (Sb), gold (AU), copper (Cu), or another suitable metal.

The chalcogenide layer 108 is fabricated on the first conductor layer 106 and may have a height of about 300 angstroms. Alternatively, the height of the chalcogenide layer 108 may be another suitable height. The chalcogenide layer 108 may comprise GexSe(100-x), where x may be in the range of about 18 to about 40, such as 20, 25, or 40. For example, the chalcogenide layer 108 may comprise Ge40Se60, which also may be expressed as Ge2Se3. Alternatively, the chalcogenide layer 108 may comprise, for example, cadmium and tellurium, which may form cadmium telluride (CdTe), or other suitable elements.

The metal chalcogenide layer 110 is fabricated on the chalcogenide layer 108 and may have a height of about 500 angstroms. Alternatively, the height of the metal chalcogenide layer 110 may be another suitable height. The metal chalcogenide layer 110 may comprise materials such as PbSe, SnSe, In2Se3, Ag2Se, Sb2Se3, Cu2Se, or other suitable materials.

The metal layer 112 may be fabricated over the metal chalcogenide layer 110 and may have a height of about 150 angstroms. Alternatively, the height of the metal layer 112 may be another suitable height. The metal layer 112 may comprise silver, copper, or another suitable metal.

The second conductor 116 may be fabricated directly on the metal layer 112. Alternatively, the second conductor 116 may connect to the metal layer 112 through an adhesive layer 114 that may aid in the connection of dissimilar materials. The adhesive layer may comprise, for example, a Metal-doped Ge2Se3 layer, such as Ag-doped Ge2Se3, Cu-doped Ge2Se3, or another suitable material. The second conductor 116 may comprise the same material as the first conductor 106, the same material as the metal layer 112, or may comprise, for example, copper, silver, aluminum, tungsten, or another suitable conductive material.

The second conductor 116 may connect to further conductive layers or circuitry, such as a voltage plane, a ground plane, a voltage supply, a driver circuit, a difference amplifier, a sense amplifier, or to other suitable circuitry, and may correspond with or complement conductive layers or circuitry that the first conductor 106 may be connected with.

An insulative fill layer 118 is also shown in FIG. 1, which may fill the spaces that are above and/or to the sides of the layers 106 through 116 of the integratable programmable capacitive device 100. The insulative layer 118 may encapsulate the integratable programmable capacitive device 100. The fill layer 118 may act to physically support the integratable programmable capacitive device 100 and may further act to isolate the layers. For example, the fill layer 118 may act to reduce effects from electric and/or magnetic fields that may be produced from or near the integratable programmable capacitive device 100.

After the layers of the integratable programmable capacitive device 100 have been fabricated, a capacitance characteristic of the integratable programmable capacitive device 100 may be programmed. For an integratable programmable capacitive device 100 of about 0.25 micrometers in diameter in contact with the bottom electrode and with active material under the top electrode having an area of about 80 micrometers by about 80 micrometers, the capacitance may be programmed to be within a range from about 20 femtoFarads to about 100 picoFarads. To program the capacitance, a voltage may be applied across the first and second conductors 106, 116. The voltage may be a short pulse and may influence molecules from the metal layer 112 to move into the metal chalcogenide layer 110.

For example, if the metal layer 112 comprises silver, silver molecules may migrate from the metal layer 112 into the metal chalcogenide layer 110 upon application of the voltage. Characteristics of the voltage, such as, the magnitude and/or the rise time may determine the amount of silver that migrates into the metal chalcogenide layer 110. For larger programmed capacitances, a larger amount of the silver should be migrated into the metal chalcogenide layer 110.

Some or all of the metal of the metal layer 112 may be integrated into the metal chalcogenide layer 110 at the time of fabrication of the layer through, for example, by a sputtering process, photo diffusion, thermal diffusion, or another suitable process. Thus, in some embodiments, the metal layer 112 may be reduced in height or omitted.

Figure 2:
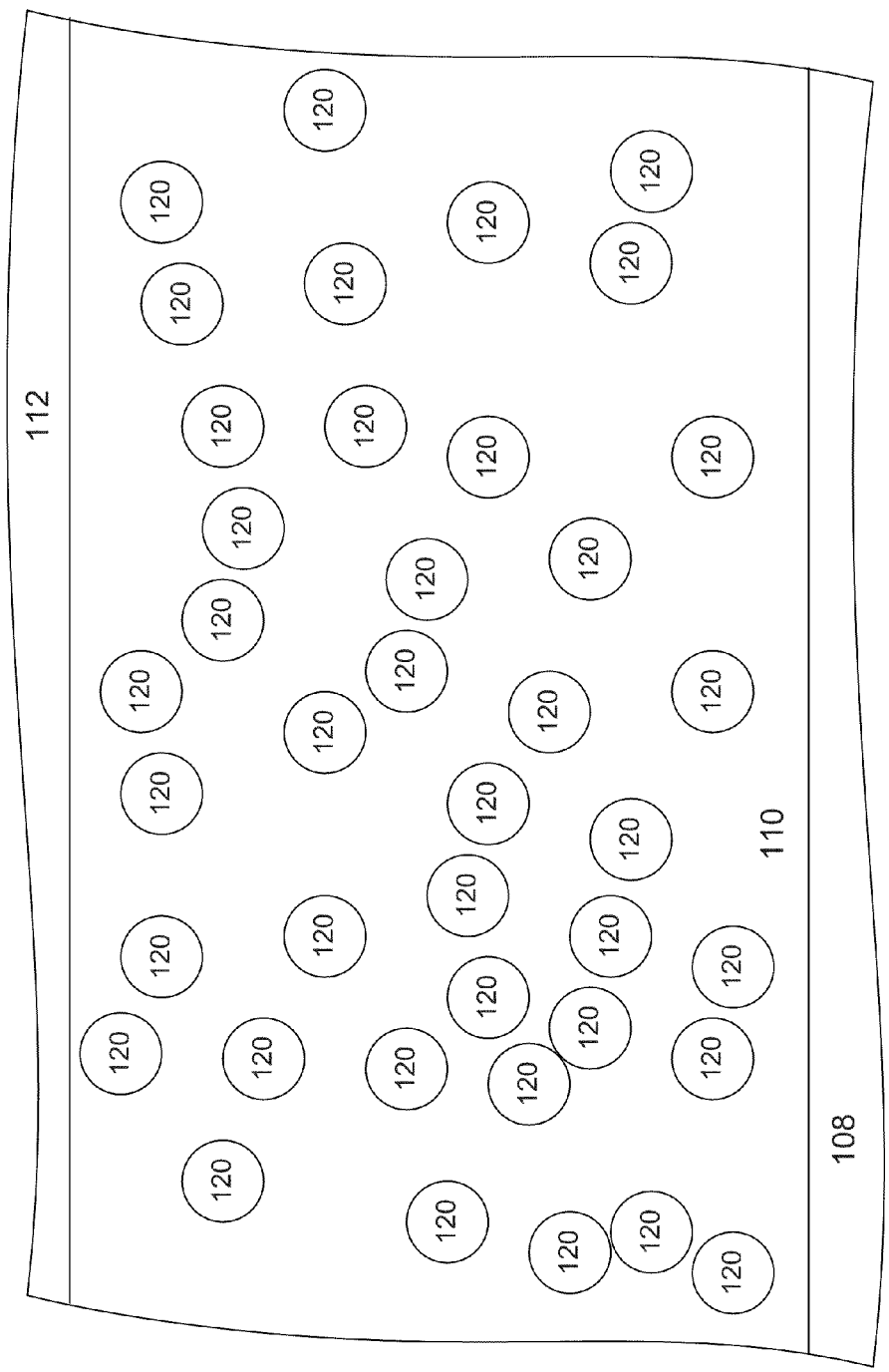
FIG. 2 is a close up view of a quantum dot doped metal chalcogenide layer.

FIG. 2 is a close up, cut away view of a portion of the integratable programmable capacitive device 100 of FIG. 1, after the capacitance characteristic has been programmed. As shown in FIG. 2, when metal from the metal layer 112 is migrated into the metal chalcogenide layer 110, small nodules of the metal, quantum dots 120, are formed throughout the metal chalcogenide layer 110. The metal chalcogenide layer 110 is effectively doped with quantum dots 120.

Typically, quantum dots 120 resonate within a set range of frequencies at a set range of voltages. Electrons may move or "tunnel" from one quantum dot 120 to another quantum dot 120 when conditions are favorable. This phenomenon is referred to as quantum tunneling or the tunnel effect. Generally, more favorable conditions lead to more electrons moving through the material.

The flow of electrons enabled by tunneling may be controlled. Electron mobility through the quantum dot doped metal chalcogenide layer 110 may be high or may be substantially stopped, depending on the voltage across the first and second conductors 106, 116. For example, if a tunneling flow of electrons is started and then stopped within suitable parameters, the quantum dots 120 will each continue to hold a measurable charge. Because the tunneling behavior has been inhibited, the charge remaining on the quantum dots 120 has no path through which to discharge, and will thus remain in the integratable programmable capacitive device 100 for a substantial amount of time. For example, the integratable programmable capacitive device 100 may hold a charge for long enough to be used as a semi-non-volatile memory device, with a long refresh time, such as a refresh time that is about one second. In another example, the integratable programmable capacitive device 100 may hold a charge for long enough to be considered a non-volatile memory device. By contrast, modern DRAM has a refresh rate of about 0.066 seconds or 66 milliseconds, meaning that each memory bit must be refreshed every 66 milliseconds.

Control of the tunneling behavior allows the integratable programmable capacitive device 100 to act like a capacitor. When quantum dots 120 hold charge, the integratable programmable capacitive device 100 appears as a charged capacitor. Alternatively, a voltage may be applied across the first and second conductors 106, 116 to discharge the quantum dots 120, making the integratable programmable capacitive device 100 appear as a discharged capacitor. Further, the integratable programmable capacitive device 100 may charged and discharged in a manner similar to many known capacitors. For example, charge may be stored in and/or released from the integratable programmable capacitive device 100 in a controlled and predictable way.

When the capacitance of the integratable programmable capacitive device 100 has been set (i.e., metal has been suitably introduced into the metal-chalcogenide layer 110), the integratable programmable capacitive device 100 exhibits a DNR characteristic as well as an increased capacitance.

Figure 3:
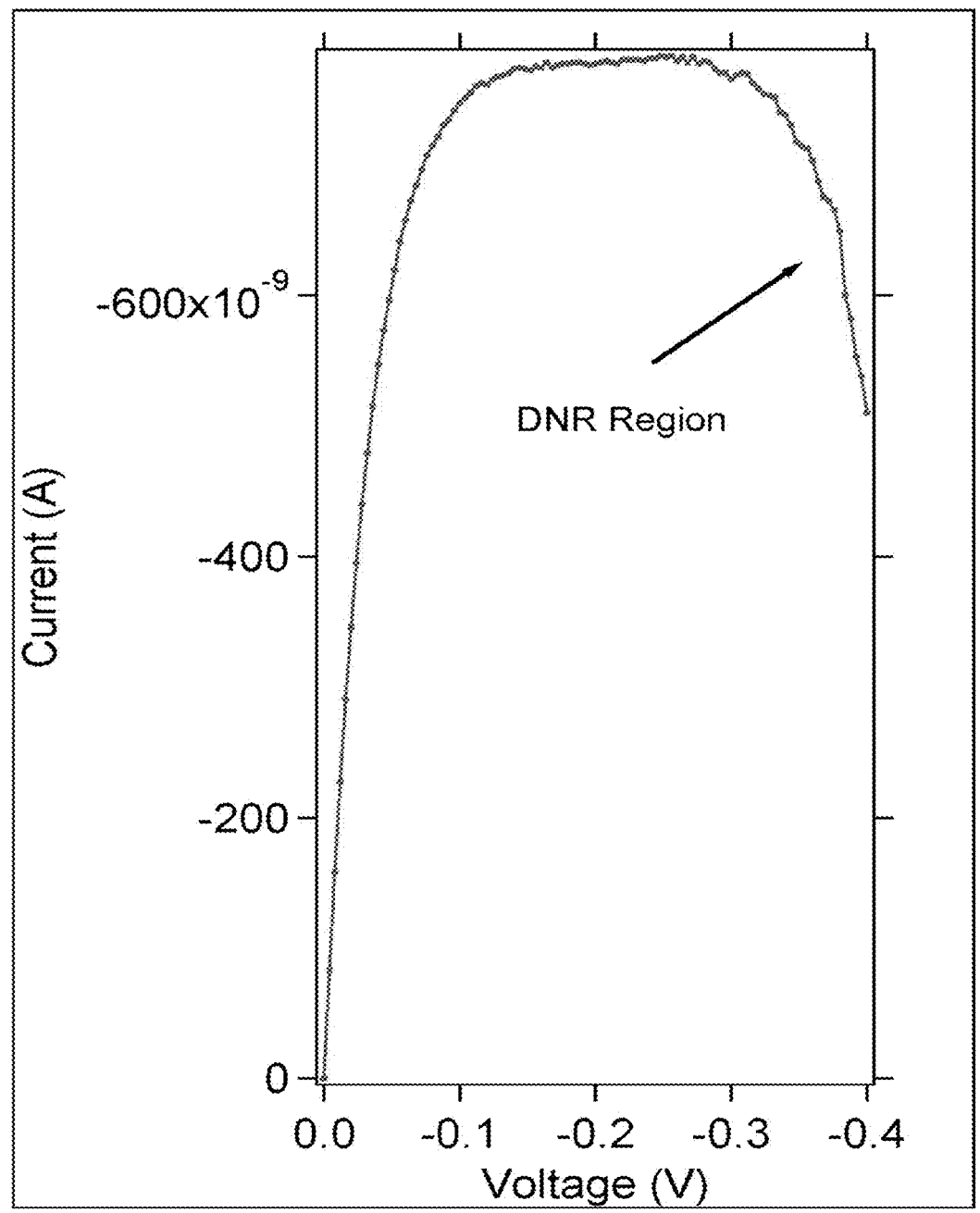
FIG. 3 is a current-voltage graph showing the I-V curve of the embodiment of the integratable programmable capacitive device of FIG. 1.

FIG. 3 shows an electric current (I) (labeled as "A" for Amperes or Amps, on FIG. 1) versus voltage (V) graph illustrating a typical I-V curve of an embodiment of the integratable programmable capacitive device 100. The I-V curve illustrates the DNR characteristic of the integratable programmable capacitive device 100. Moving from zero to positive voltage, the current increases until the voltage reaches about 0.2 volts, where the current peaks. Near this peak, an increase in voltage does not result in an increase in current. In fact, as the voltage increases beyond the peak, the current begins to drop, illustrating the start of a DNR region. Thereafter, the I-V curve may show a voltage minimum or trough (not shown) such that as the voltage increases past the voltage minimum, the current may again begin to increase, illustrating the end of the DNR region.

Figure 4:
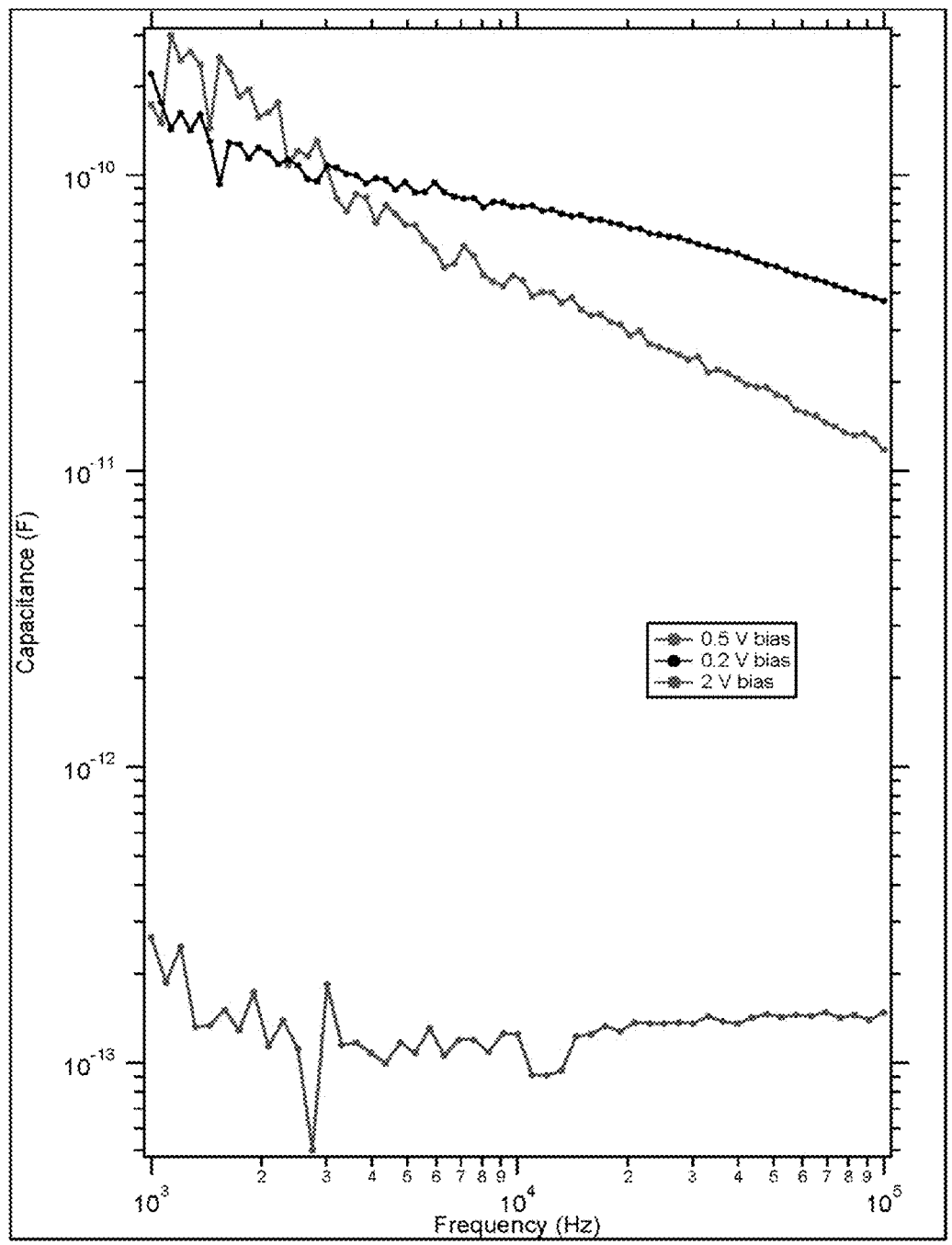
FIG. 4 is a graph of capacitance versus frequency of the embodiment of the integratable programmable capacitive device of FIG. 1.

FIG. 4 shows a graph that illustrates a capacitance characteristic of an embodiment of the integratable programmable capacitive device 100 over a range of frequencies on a logarithmic scale. The integratable programmable capacitive device 100 that was measured to generate the data used to create the graph shown in FIG. 4 has a diameter of about 0.25 micrometer (250 nanometers) and a height of about 150 nanometers. By contrast, a typical charge container used in modern DRAM circuits may be about 90 nanometers in diameter and have a height of about 1 micrometer (1,000 nanometers). As illustrated in FIG. 4, the frequency response of the tested integratable programmable capacitive device 100 is shown at three test voltages (0.2V, 0.5V, and 2.0V) and across a range of frequencies (from about 1 kilohertz (KHz) to about 100 KHz).

As seen in FIG. 4, the graph lines illustrating operation at 0.2V and 0.5V indicate a much higher capacitance than the graph line illustrating operation at 2.0V. The graph line illustrating operation at 0.2V shows a capacitance that is comparable with the capacitance of the 0.5V graph line at lower frequencies. At higher frequencies, the graph line illustrating operation at 0.2V shows a much greater capacitance than the 0.5V graph line. The line illustrating 2.0V may indicate a breakdown in the device. A device breakdown may indicate, for example, metal migration due to the increased voltage, breaking down the tunnel effect.

As can be seen in FIG. 4, the tested integratable programmable capacitive device 100 has a capacitance in the range of 0.1 nanoFarads (10-10 F) at about 3 KHz and at 0.2V operating voltage. By contrast, capacitive charge containers used in modern DRAM circuits operate at a capacitance measuring in the femtoFarad range (10-15 F). Thus, the integratable programmable capacitive device 100 of the current disclosure may have a capacitance that is many orders of magnitude larger than currently used capacitive devices, with a lateral cross-sectional area that may be considered substantially similar to the diameter of currently used capacitive devices, or at least less than one order of magnitude different. Additionally, the device currently disclosed may be only about 150 nanometers in height, rather than the about 1,000 nanometers of current charge containers. This may allow for a shortened time of fabrication and may advantageously allow stacking of charge containers comprising embodiments of the integratable programmable capacitive device 100.

Figure 5A:
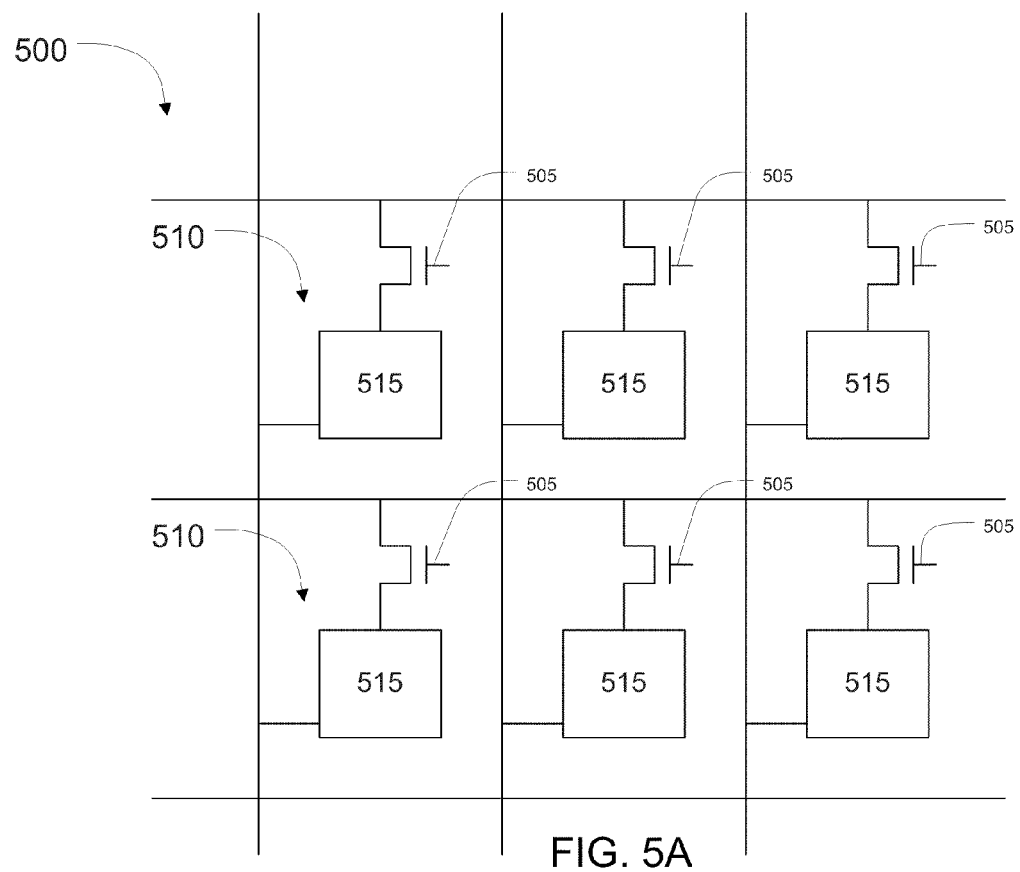
FIG. 5A is a partial view of a memory bank with an embodiment of an integratable programmable capacitive device.

FIG. 5A illustrates a partial schematic of a memory bank 500 for a DRAM circuit. As shown in FIG. 5A, a memory bit (memory bit) 510 comprising an integratable programmable capacitive device 515 may have a substantially similar design as current DRAM, with one transistor 505 and one capacitive device 515 per memory bit 510. Additionally, because the memory bits 510 have a small aspect ratio, relative to previous capacitive charge containers, banks of memory bits may be fabricated in layers. For example, a first memory bit layer may be fabricated over a second memory bit layer. Additional layers, such as insulative layers and/or isolation layers, may be fabricated between the first and second memory bit layers.

Figure 5B:
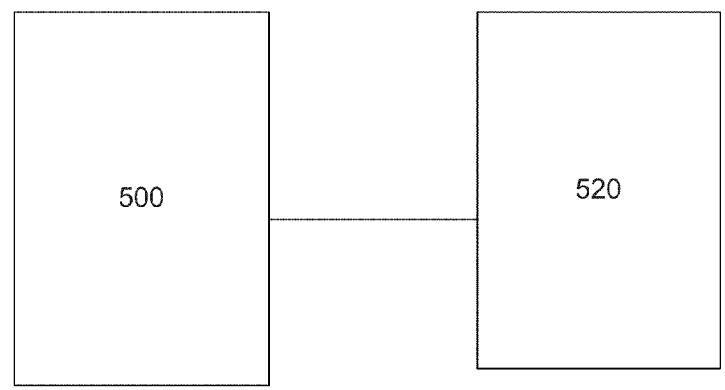
FIG. 5B is a partial block diagram of a memory circuit.

FIG. 5B is a partial block diagram of an embodiment of a memory circuit, such as DRAM. As illustrated by FIG. 5B, the memory bank 500 may be connected to a sensing device bank 520. Each memory bit 510 may be connected to one or more sensing devices within the sensing device bank 520. The sensing device bank 520 may comprise one or more sensing devices, such as, for example, differential amplifiers, sense amplifiers, capacitance sensing devices, voltage sensing devices, current sensing devices, charge sensing devices, or other suitable sensing devices.

Embodiments of the integratable programmable capacitive device 100 may also be employed as capacitive devices in other areas of a microchip or electronic device. For example, the integratable programmable capacitive device 100 may be fabricated near fast switching devices or other devices that demand power intermittently, to store and release charge. For example, a voltage may be applied to the integratable programmable capacitive device 100, and the integratable programmable capacitive device may store charge from the applied voltage. The charge stored by the integratable programmable capacitive device 100 may then be available to nearby connected conductors and/or devices if the applied voltage dips or changes substantially. As such, the integratable programmable capacitive device 100 may act as an on-die decoupling capacitor, a bypass capacitor, a power capacitor, and/or a bulk capacitor. Additionally, the integratable programmable capacitive device 100 may be used in place of capacitors used in conventional circuits.

Figure 6:
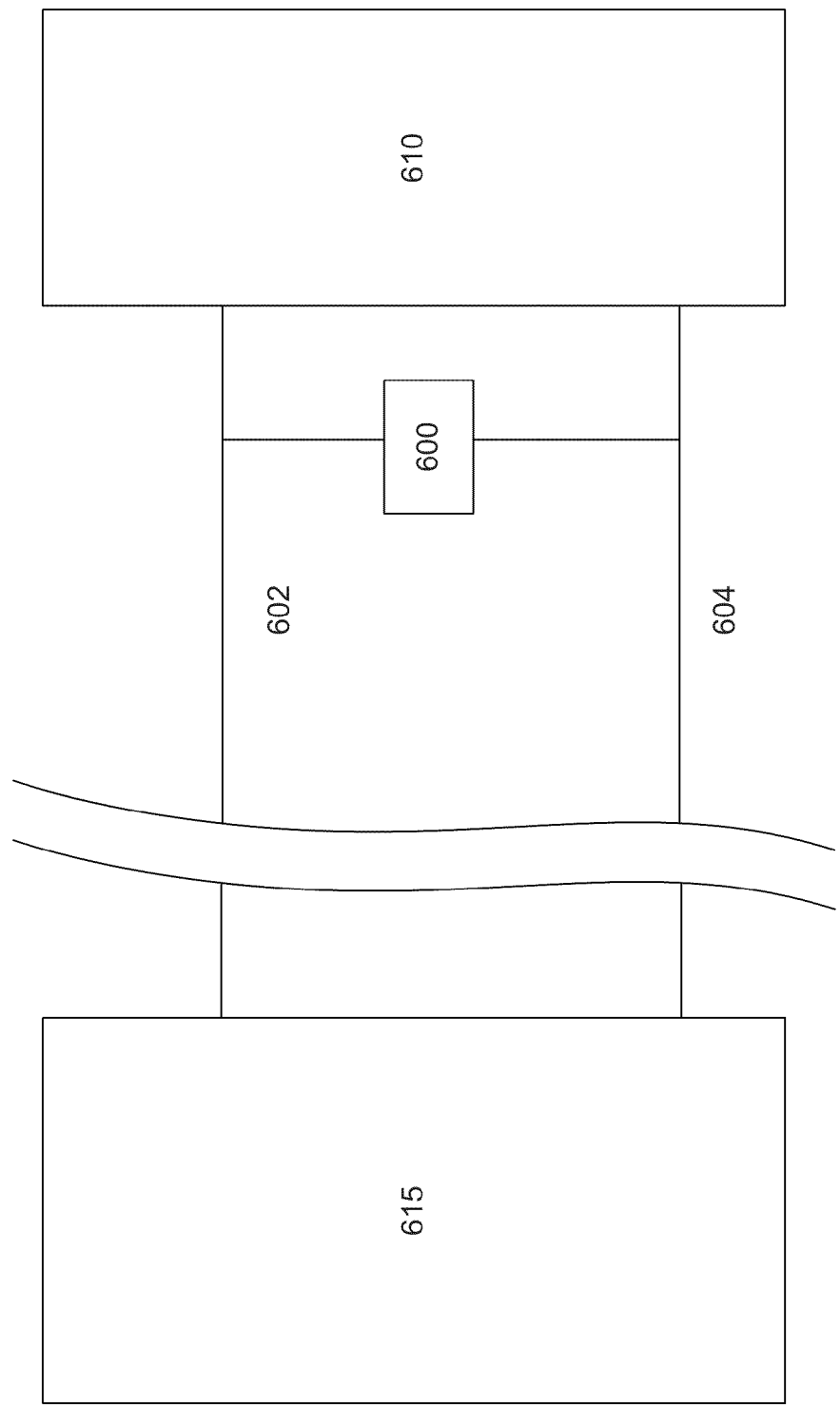
FIG. 6 is a schematic of a circuit comprising an embodiment of an integratable programmable capacitive device.

FIG. 6 shows a schematic of a circuit 610 with voltage and ground connections 602, 604. An embodiment of the integratable programmable capacitive device 600 is coupled between the voltage and ground connections to supply charge to the circuit 610 in the case that a connected source 615 cannot supply adequate current to the circuit 610 at peak usage.

Other applications for an embodiment of an integratable programmable capacitive device, such as a replacement for a bypass capacitor or for another capacitive device well known in the art, would be apparent to one of ordinary skill in the art, given the benefit of this disclosure.

Although this invention has been described in terms of certain preferred embodiments, other embodiments that are apparent to those of ordinary skill in the art, including embodiments that do not provide all of the features and advantages set forth herein, are also within the scope of this invention. Therefore, the scope of the present invention is defined only by reference to the appended claims and equivalents thereof.

What is claimed is:

1. A circuit comprising:
   a capacitive device, the capacitive device comprising:
   a first conductor;
   a chalcogenide layer connected to the first conductor;
   a metal chalcogenide layer connected to the chalcogenide layer; and
   a second conductor connected to the metal chalcogenide layer,
   wherein the capacitive device is configured to store charge.

2. The circuit of claim 1, further comprising a source, the source having a positive terminal connected to the first conductor and a negative terminal connected to the second conductor.

3. The circuit of claim 1, further comprising a source, the source having a positive terminal connected to the second conductor and a negative terminal connected to the first conductor.

4. The circuit of claim 1, wherein the capacitive device has a capacitance between the range of about 100 femtoFarads to about 100 picoFarads.

5. The circuit of claim 1, wherein the capacitive device is configured to operate at a voltage of about 0.2 volts.

6. The circuit of claim 1, wherein the device further comprises a metal layer disposed between the metal chalcogenide layer and the second conductor, the metal chalcogenide layer being connected to the second conductor through the metal layer.

7. The circuit of claim 6, wherein the metal layer comprises lead, tin, silver, indium, antimony, gold, or copper.

8. A memory circuit comprising:
   a capacitive device connected to a sensing device,
   the capacitive device comprising
   a first conductor;
   a chalcogenide layer connected to the first conductor;
   a metal chalcogenide layer connected to the chalcogenide layer; and
   a second conductor connected to the metal chalcogenide layer;
   wherein the capacitive device is configured to store a charge.

9. The memory circuit of claim 8, wherein the sensing device is configured to sense the charge stored in the capacitive device.

10. The memory circuit of claim 8, wherein the sensing device comprises a sense amplifier.

11. The memory circuit of claim 8, wherein the first conductor is connected to a voltage plane and the second conductor is connected to a transistor.

12. The memory circuit of claim 8, wherein the second conductor is connected to a voltage plane and the first conductor is connected to a transistor.

13. A method comprising:
   providing a capacitive device comprising a metal chalcogenide layer disposed between a first conductor and a second conductor;
   connecting the first conductor and the second conductor to a source;
   applying a first voltage across the first and second conductors with the source;
   storing charge from the applied voltage in the capacitive device,
   wherein the charge is substantially stored in the metal chalcogenide layer.

14. The method of claim 13, further comprising removing the applied voltage from the first conductor and the second conductor after storing the charge.

15. The method of claim 14, further comprising measuring the stored charge at the first and second conductors after removing the applied voltage.

16. The method of claim 15, wherein the stored charge is measured by a circuit comprising a sense amplifier.

17. The method of claim 13, further comprising releasing at least a portion of the stored charge from the device if the first voltage applied across the first and second conductors is substantially reduced.

18. The method of claim 13, wherein the capacitive device further comprises a metal layer connected to the metal chalcogenide layer.

19. The method of claim 18, further comprising setting the capacitance of the capacitive device by applying a second voltage to the capacitive device and migrating metal from the metal layer into the metal chalcogenide layer.

20. The method of claim 18, further comprising setting the capacitance of the capacitive device by applying a second voltage to the capacitive device and migrating metal from the metal chalcogenide layer into the metal layer.

* * * * *

UNITED STATES PATENT AND TRADEMARK OFFICE
CERTIFICATE OF CORRECTION

PATENT NO. : 8,284,590 B2  
APPLICATION NO. : 12/775237  
DATED : October 9, 2012  
INVENTOR(S) : Kristy Campbell Page 1 of 1

It is certified that error appears in the above-identified patent and that said Letters Patent is hereby corrected as shown below:

Specification

Column 1, Line 4, insert

--STATEMENT REGARDING FEDERALLY SPONSORED RESEARCH OR DEVELOPMENT

This invention was made with government support under Contract Nos. FA9550-07-1-0546 and FA9453-08-2-0252 awarded by the Air Force Research Laboratory. The government has certain rights in the invention. In addition the government has a paid-up license in this disclosure and the right in limited circumstances to require the patent owner to license others on reasonable terms as provided for by the terms of contracts/grants EAR-0710949 and DMS-0934680, granted by the National Science Foundation.--

Signed and Sealed this
Twelfth Day of April, 2016

Michelle K. Lee
*Director of the United States Patent and Trademark Office*